United States Patent
Kim et al.

(10) Patent No.: US 6,741,512 B2
(45) Date of Patent: May 25, 2004

(54) INTEGRATED CIRCUIT MEMORY DEVICES HAVING EFFICIENT MULTI-ROW ADDRESS TEST CAPABILITY AND METHODS OF OPERATING SAME

(75) Inventors: Sung-hoon Kim, Seoul (KR); Chul-soo Kim, Kyungki-do (KR); Hong-goo Yoon, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/392,428

(22) Filed: Mar. 19, 2003

(65) Prior Publication Data

US 2003/0174567 A1 Sep. 18, 2003

Related U.S. Application Data

(62) Division of application No. 09/883,070, filed on Jun. 15, 2001, now Pat. No. 6,577,545.

(30) Foreign Application Priority Data

Jul. 11, 2000 (KR) ........................... 2000-39560

(51) Int. Cl.⁷ .............................. G11C 7/00; G11C 8/00; G11C 29/00
(52) U.S. Cl. .................. 365/201; 365/221; 365/189.08; 365/196; 365/200; 365/225.7; 365/230.06; 365/239; 365/203
(58) Field of Search ................................ 365/201, 200, 365/225.7, 221, 203

(56) References Cited

U.S. PATENT DOCUMENTS

| | | | | |
|---|---|---|---|---|
| 4,885,720 A | | 12/1989 | Miller et al. ................. | 365/200 |
| 5,278,794 A | * | 1/1994 | Tanaka et al. .......... | 365/185.17 |
| 5,475,640 A | | 12/1995 | Kersh et al. ............ | 365/189.05 |
| 5,519,657 A | | 5/1996 | Arimoto ..................... | 365/200 |
| 5,576,633 A | * | 11/1996 | Rountree et al. ............ | 326/10 |
| 5,619,460 A | * | 4/1997 | Kirihata et al. ............. | 365/201 |
| 5,742,547 A | | 4/1998 | Lee .......................... | 365/200 |
| 5,748,543 A | | 5/1998 | Lee et al. .................. | 365/200 |
| 5,845,315 A | | 12/1998 | Cutter .................... | 365/189.05 |
| 5,907,514 A | | 5/1999 | Lee et al. .................. | 365/194 |
| 6,144,577 A | * | 11/2000 | Hidaka ........................ | 365/63 |
| 6,160,745 A | * | 12/2000 | Hashimoto .................. | 365/200 |
| 6,195,762 B1 | * | 2/2001 | Shore ............................ | 714/8 |
| 6,205,050 B1 | | 3/2001 | Tamaki ....................... | 365/154 |
| 6,208,570 B1 | | 3/2001 | Brown et al. ................ | 365/200 |
| 6,215,712 B1 | * | 4/2001 | Yanagisawa ................ | 365/201 |
| 6,222,783 B1 | * | 4/2001 | Komoriya et al. .......... | 365/200 |
| 6,233,181 B1 | | 5/2001 | Hidaka ........................ | 365/190 |

(List continued on next page.)

FOREIGN PATENT DOCUMENTS

| | | | | |
|---|---|---|---|---|
| JP | 6-84394 | | 3/1994 | |
| KR | 2001027886 A | * | 4/2001 | ........... G11C/29/00 |

*Primary Examiner*—David Nelms
*Assistant Examiner*—Ly Duy Pham
(74) *Attorney, Agent, or Firm*—Myers Bigel Sibley & Sajovec

(57) ABSTRACT

Integrated circuit memory devices include a word line driver circuit electrically coupled to a plurality of rows of normal memory cells and at least one row of spare memory cells that can be used to replace normal rows having defective cells therein. The word line driver circuit includes a spare word line driver that is electrically coupled to the at least one row of spare memory cells. The spare word line driver includes a programmable address decoder, which generates a spare word line driver enable signal and is responsive to a plurality of row addresses, and a selector switch that is responsive to the spare word line driver enable signal. To assist in performing a multi-row address test, a spare word line driver enable signal precharger is provided that resets the spare word line driver enable signal to a logic level that turns on the selector switch when the memory device is undergoing a multi row address test.

3 Claims, 6 Drawing Sheets

U.S. PATENT DOCUMENTS

| | | | |
|---|---|---|---|
| 6,243,307 B1 | 6/2001 | Kawagoe | 365/200 |
| 6,249,467 B1 * | 6/2001 | Pereira et al. | 365/200 |
| 6,275,426 B1 * | 8/2001 | Srinivasan et al. | 365/200 |
| 6,310,806 B1 * | 10/2001 | Higashi et al. | 365/200 |
| 6,373,761 B1 * | 4/2002 | Shore et al. | 365/201 |
| 6,397,349 B2 | 5/2002 | Higgins et al. | 714/7 |
| 6,405,324 B2 | 6/2002 | Shore | 714/11 |
| 6,418,066 B1 | 7/2002 | Hidaka | 365/198 |
| 6,418,067 B1 * | 7/2002 | Watanabe et al. | 365/200 |
| 6,445,628 B1 | 9/2002 | Pereira et al. | 365/200 |

* cited by examiner

INTEGRATED CIRCUIT MEMORY DEVICES HAVING EFFICIENT MULTI-ROW ADDRESS TEST CAPABILITY AND METHODS OF OPERATING SAME

REFERENCE TO COPENDING APPLICATION

This application is a divisional of U.S. application Ser. No. 09/883,070, filed Jun. 15, 2001 now U.S. Pat. No. 6,577,545, the disclosure of which is hereby incorporated herein by reference.

FIELD OF THE INVENTION

The present invention relates to semiconductor memory devices, and, more particularly, to semiconductor memory devices that utilize spare memory cells to replace normal memory cells that are defective.

BACKGROUND OF THE INVENTION

Dynamic random access memory (DRAM) devices typically comprise large arrays of memory cells. A semiconductor memory device is frequently treated as defective if one or more memory cells does not operate properly. As the integration density and the processing rate of semiconductor memory devices increase, the probability of occurrence of a defective cell increases. Accordingly, the yield of a wafer, which determines the manufacturing cost of DRAMs and is represented by the ratio of the number of non-defective chips to the total number of chips manufactured on a single wafer, may decrease. To improve the yield of a wafer for memory devices having a high integration density, methods for correcting defective cells become increasingly important.

To correct defective cells, redundancy technology has been used. Conventional redundancy technology uses a spare (i.e., redundant) memory cell block located near a normal memory cell block. FIG. 1 is a partial block diagram illustrating a conventional semiconductor memory device in which defective cells within a normal memory cell block are replaced using a spare memory cell block. Referring to FIG. 1, a semiconductor memory device 100 includes a memory cell block 110 having a plurality of memory cells in rows and columns. The memory cell block 110 is divided into a normal memory cell block NCB and a spare memory cell block SCB. The semiconductor memory device 100 also includes a normal word line driver 120 for driving a word line connected to cells within the normal memory cell block NCB and a spare word line driver 130 for driving a word line connected to cells within the spare memory cell block SCB.

The normal word line driver 120 is illustrated in FIG. 2. The normal word line driver 120 includes a precharger 210, a selector 220, a normal word line driver enabler 230 and a driver 240. PMOS transistors 211 and 212 are turned on in response to activation of a precharge signal PREB to a logic "low" level so that nodes A and B are precharged to the level of a power supply voltage VCC. The precharge signal PREB is activated to a logic "low" level before a word line driving operation is performed. The logic "high" levels of the nodes A and B pass through the respective inverters of the normal word line driver 240 and then become logic "low" levels at normal word lines NWE0 and NWE1. When the normal word lines NWE0 and NWE1 are held at the logic "low" level, the rows of memory cells that are connected to NEW0 and NEW1 within the normal memory cell block NCB are inactive.

When a normal word line enable signal FB is activated to a logic "high" level, an NMOS transistor 231 in the normal word line driver enabler 230 is turned on and the normal word line driver 120 is enabled. NMOS transistors 221 and 222 within the selector 220 are selectively turned on in response to internal address signals DRAiB and DRAi. The internal address signals DRAiB and DRAi may be generated by an address decoder (not shown) using conventional techniques. When the internal address signal DRAiB is at a logic "high" level, the NMOS transistor 221 in the selector 220 is turned on. When this occurs, the signal at node A transitions from a logic "high" level to a logic "low" level. The logic "low" level at node A causes the inverter within the driver 240 to drive the normal word line NWE0 to a logic "high" level. The normal word line NWE0 at the logic "high" level selects a row of memory cells MC0 within the normal memory cell block NCB of FIG. 1. The timing chart of this operation is illustrated in FIG. 3.

Referring again to FIG. 1, when a selected memory cell MC0 in the normal memory cell block NCB is defective, the memory cell MC0 is replaced by a spare memory cell SC0 in the spare memory cell block SCB. As will be understood by those skilled in the art, the occurrence of a defective memory cell within a normal row of memory cells typically causes the entire row to be replaced by a spare row. To achieve this replacement, operation, the semiconductor memory device 100 is provided with a spare word line driver 130 for selecting a row of spare memory cells SC0. The spare word line driver 130 is shown in FIG. 4.

Referring to FIG. 4, the spare word line driver 130 includes a precharger 410, a selector 420, a spare word line enabler 430 and a driver 440. The spare word line driver 130 also includes a spare word line driver enable signal line precharger 450 and a programmable decoder 460. A PMOS transistor 451 in the spare word line driver enable signal precharger 450 is turned on in response to activation of the precharger signal PREB to a logic "low" level. This causes a first spare word line driver enable signal F to become a logic "high" level. Here, fuses F1 and F2 within the programmable decoder 460 may be selectively cut when a defective cell within the normal memory cell block NCB has been identified. For example, when the memory cell selected by the internal address signal DRAiB in the normal memory cell block NCB is defective, the fuse F1 in the programmable decoder 460 is cut. Therefore, since the fuse F1 is cut, the spare word line driver enable signal F does not become a logic "low" level even if the NMOS transistor 461 is turned on in response to the logic "high" level of the internal address signal DRAiB.

Thereafter, when a second spare word line driver enable signal PRAD is activated to a logic "high" level, an NMOS transistor 431 in the spare word line driver enabler 430 is turned on. When this occurs, node C is pulled to a logic "low" level through the NMOS transistor 421 (turned on in response to an enable signal F having a "high" logic level) and the NMOS transistor 431. The logic "low" level at the node C passes through the inverter within the driver 440 and thus becomes a logic "high" level at a spare word line SWE. The spare word line SWE at the logic "high" level selects the spare memory cell SC0 in the spare memory cell block SCB. The row of spare memory cells can replace the row of defective memory cells MC0 in the normal memory cell block NCB.

The operation of such a semiconductor memory device 100 can be verified by testing for defective cells. To reduce test time, a multi row address test method in which a plurality of word lines are sequentially driven and tested in response to a single command has been proposed. However, this test method typically has the following problems which will be described with reference to FIG. 5. For purposes of illustration herein, it is assumed that an internal address used for addressing a defective cell within a normal memory cell block is DRAiB. When an internal address DRAi addressing a non-defective cell is input to a semiconductor memory device during a multi-row address test, a normal word line NWE is enabled, and the first spare word line driver enable signal F transitions from a logic "high" level to a logic "low" level. This transition of the enable signal F to a logic "low" level occurs because the NMOS transistor 462 in the decoder 460 of FIG. 4 is turned on in response to the address signal DRAi. Thereafter, the first spare word line driver enable signal F should become a logic "high" level and turn on the selector 420 when the internal address DRAiB addressing a defective cell is input. However, the first spare word line driver enable signal F is maintained at the logic "low" level after the address signal DRAi is applied. Accordingly, a spare word line SWE is not enabled when the internal address DRAiB is applied. This limitation associated with the circuit of FIG. 4 reduces the effectiveness of the test method whereby the normal word line NWE and the spare word line SWE are sequentially enabled during the test.

Thus, notwithstanding conventional memory devices and test methods for identifying defective memory cells within the memory devices, there continues to be a need for memory devices that can be tested more efficiently.

SUMMARY OF THE INVENTION

Integrated circuit memory device according to embodiments of the present invention improve the efficiency of performing multi-row address testing by enabling the reset of enable signal lines connected to spare word line driver circuits after commencement of the test. According to one embodiment of the present invention, an integrated circuit memory device includes a normal memory cell block, having a normal word line electrically coupled thereto, and a spare memory cell block having a spare word line electrically coupled thereto. A word line driver circuit is also provided. The word line driver circuit has a normal word line driver electrically coupled to the normal word line and a spare word line driver electrically coupled to the spare word line. The spare word line driver comprises a programmable address decoder that generates a spare word line driver enable signal (F) on an enable signal line. The spare word line driver also comprises a spare word line driver enable signal precharger that is electrically coupled to the enable signal line. The spare word line driver enable signal precharger, which is responsive to a multi-row address test signal (MRAD), performs the function of resetting the enable signal line after commencement of the multi-row address test. The spare word line driver enable signal precharger may also be responsive to a row active command signal that is asserted repeatedly during the multi-row address test. The spare word line driver may also comprise a selector switch that is responsive to the spare word line driver enable signal.

According to another embodiment of the present invention, the spare word line driver is electrically coupled to a row of spare memory cells and includes a programmable address decoder that generates a spare word line driver enable signal (F) and is responsive to a plurality of row addresses. A spare word line driver enable signal precharger is also provided that resets the spare word line driver enable signal to a logic level that turns on the selector switch when the memory device is undergoing a multi row address test. The spare word line driver may also include circuitry that resets the selector switch from an off-state to an on-state after performance of an address test on at least one row of normal memory cells within said plurality of rows of normal memory cells.

According to still another embodiment of the present invention, a semiconductor memory device is provided that can undergo an efficient multi row address test, during which a plurality of word lines are sequentially enabled and tested. The semiconductor memory device includes a normal memory cell block and a spare memory cell block. A normal word line driver is also provided for enabling word lines connected to memory cells within the normal memory cell block, and a spare word line driver is provided for enabling word lines connected to spare cells within the spare memory cell block.

The spare word line driver may include a selector for activating the spare word line driver in response to a spare word line enable signal and thus enabling a spare word line, a programmable decoder for generating the spare word line enable signal by selectively cutting a plurality of fuses in response to address signals of a defective cell. A spare word line enable signal precharger for precharging the spare word line enable signal. This precharging operation is performed in response to a multi row address test signal, indicating a multi row address test, and a row active command signal that is generated depending on the address signals, during the test.

In another embodiment, the spare word line driver includes a selector for activating the spare word line driver in response to a spare word line enable signal and thus enabling the spare word line, a programmable decoder for generating the spare word line enable signal by selectively cutting a plurality of fuses in response to address signals of a defective cell, and a spare word line enable signal precharger for precharging the spare word line enable signal in response to the transition of the address signals while a multi row address test signal is in an activated state, during the test.

A method of testing a semiconductor memory device includes the steps of driving a word line connected to a memory cell within a normal memory cell block in response to input address signals and generating a spare word line enable signal by selectively cutting a plurality of fuses within a programmable decoder (with the cut fuses corresponding to defective rows of cells) when the memory cell corresponding to the address signals in the normal memory cell block is a defective cell. A step is also performed to precharge the spare word line enable signal in response to a multi row address test signal indicating the multi row address test and a row active command signal generated depending on the address signals. A spare word line connected to a spare cell in the spare memory cell block in then enabled in response to the spare word line enable signal, with the spare cell replacing the defective cell.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference numbers and characters.

Figure 1:
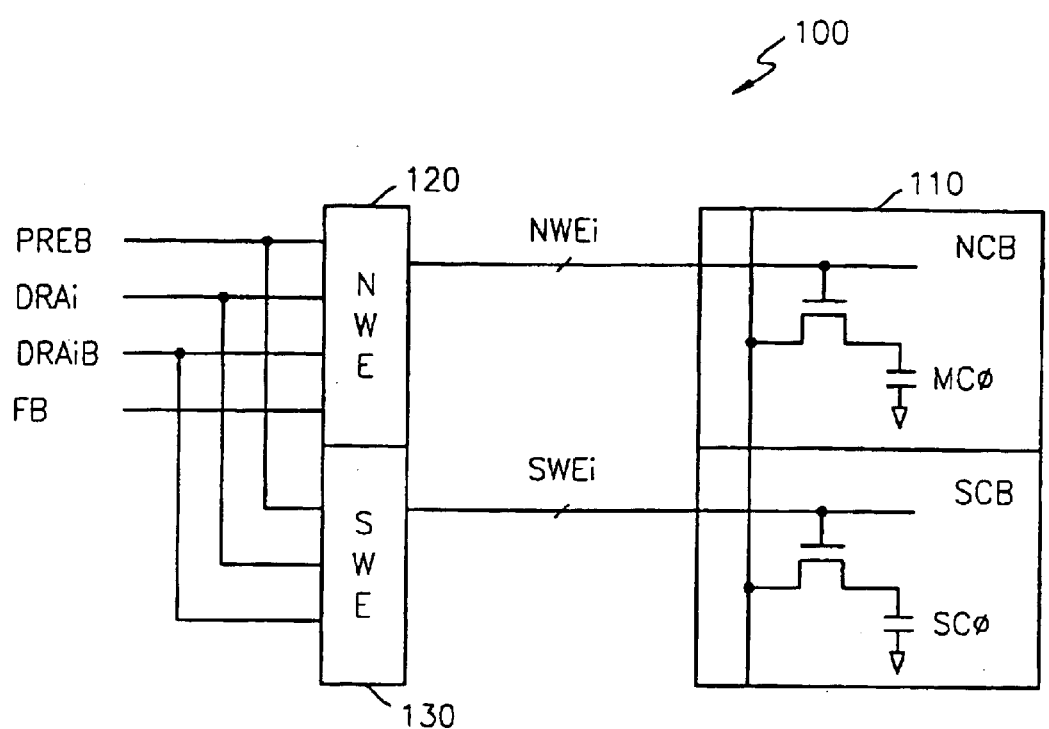
FIG. 1 is a block diagram illustrating a portion of a conventional semiconductor memory device.
Figure 2:
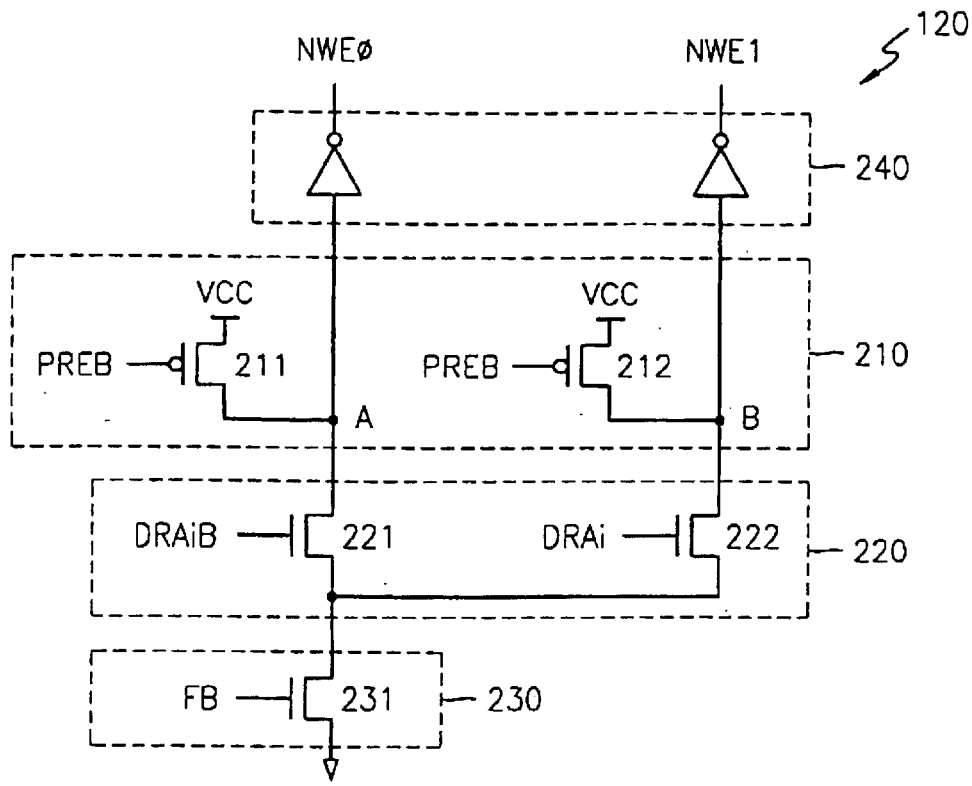
FIG. 2 is an electrical schematic of the normal word line driver of FIG. 1.
Figure 3:
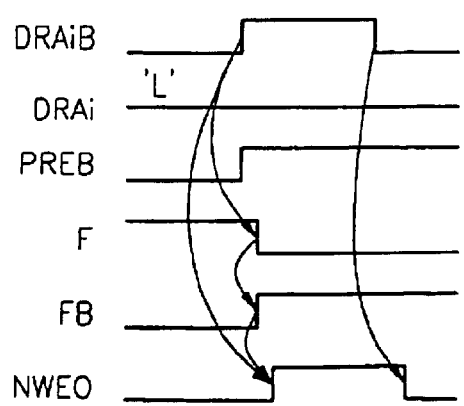
FIG. 3 is a timing diagram illustrating the operation of the normal word line driver of FIG. 2.
Figure 6:
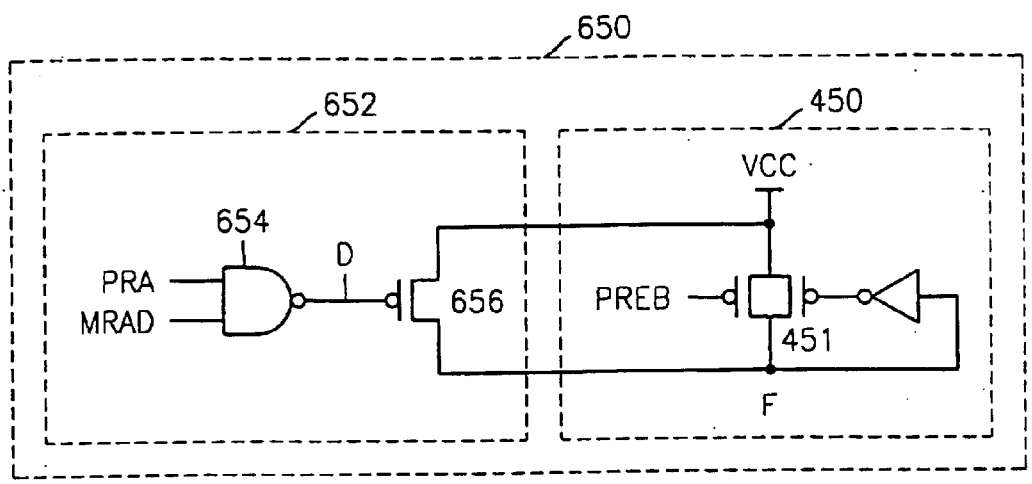
FIG. 6 is an electrical schematic of a spare word line driver enable signal precharger according to an embodiment of the present invention.
Figure 7:
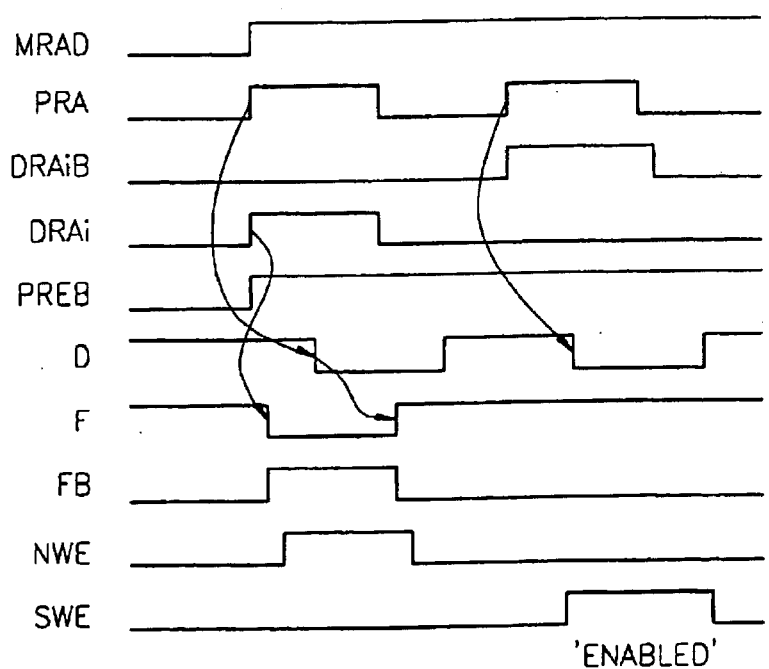
FIG. 7 is a timing diagram illustrating the operation of the precharger of FIG. 6.

Referring now to FIGS. 6–7, an integrated circuit memory device according to a first embodiment of the present invention will be described. This memory device comprises elements similar to those illustrated by FIGS. 1–2 and 4, however, the spare word line driver enable signal precharger 450 of FIG. 4 has been replaced by an enhanced spare word line driver enable signal precharger. A first embodiment of an enhanced spare word line driver enable signal precharger 650 is illustrated by FIG. 6. In particular, the enable signal precharger 650 includes a supplemental enable signal precharger 652 that is responsive to a row active command signal PRA and a multi-row address test signal MRAD. The row active command signal PRA is typically derived from a DRAM control signal, such as a row address strobe signal /RAS and address signals, and is typically generated as a pulse which is timed based on an input address signal. A two-input NAND gate 654 and a PMOS transistor 656 are provided within the supplemental enable signal precharger 652. Overlapping assertion of the row active command signal PRA to a logic 1 state (e.g., "high") with an assertion of the multi-row address test signal MRAD to a logic 1 state, will cause the output of the NAND gate 654 to switch from a logic 1 state to a logic 0 state. Thus, node D at the output of the NAND gate 654 will be driven to a logic 0 state and the PMOS transistor 656 will turn on and provide a pull-up current path, from the enable signal line F to the power supply potential Vcc, that is independent of the PMOS transistor 451. Accordingly, even if the precharger signal PREB is not asserted (i.e., driven to a logic 0 level) after commencement of a multi-row address test, the supplemental enable signal precharger 652 can independently operate to pull-up or "reset" the enable signal line F to a logic 1 level and thereby turn on the NMOS transistor 421 within the selector 420 of FIG. 4. Turn on of the NMOS transistor 421 within the selector 420 electrically connects the spare word line driver enabler 430 to the precharger 410 and the spare word line driver 440. As will be understood by those skilled in the art, the precharger signal PREB is typically not reasserted (i.e., driven to a logic 0 level) during the performance of a conventional multi-row address test when multiple word lines are being driven sequentially and tested. Instead, the precharger signal PREB is typically asserted once prior to commencement of the multi-row address test, but not reasserted thereafter during the test.

Figure 4:
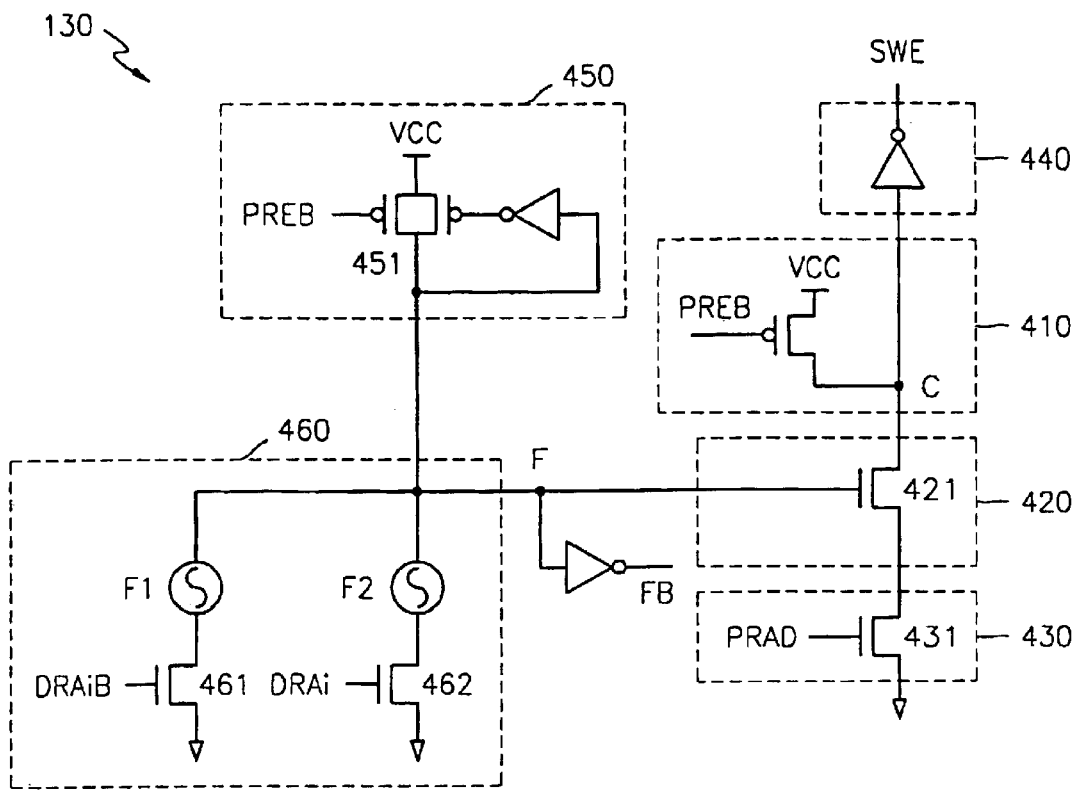
FIG. 4 is an electrical schematic of the spare word line driver of FIG. 1.
Figure 5:
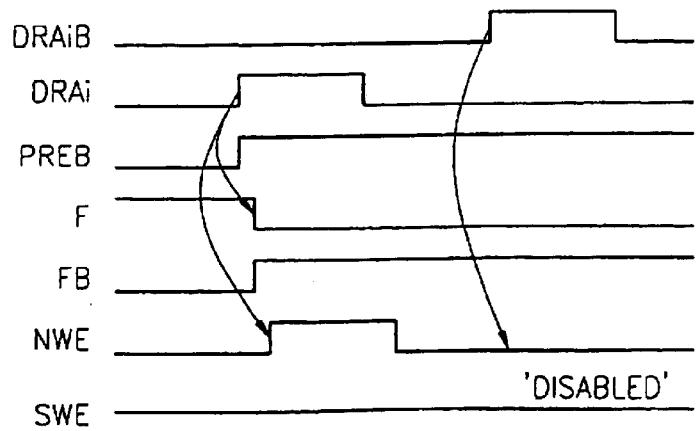
FIG. 5 is a timing diagram illustrating the operation of the spare word line driver of FIG. 4.

Operation of the spare word line driver 130 of FIG. 4, as enhanced by the supplemental enable signal precharger 652 of FIG. 6, will now be described with reference to the timing diagram of FIG. 7. As illustrated by FIG. 7, the assertion of the multi-row address test signal MRAD to a logic 1 level with the assertion of the row active command signal PRA to a logic 1 level will drive node D at the output of the NAND gate 654 to a logic 0 level and turn on the PMOS transistor 656. Accordingly, even after the transition of the address signal DRAi from a logic 0 level to a logic 1 causes the enable signal line F to be pulled low to a logic 0 level, the enable signal line F can be reset to a logic 1 level prior to performance of a spare word line test when the spare word line SWE is driven to a logic 1 level.

Figure 8:
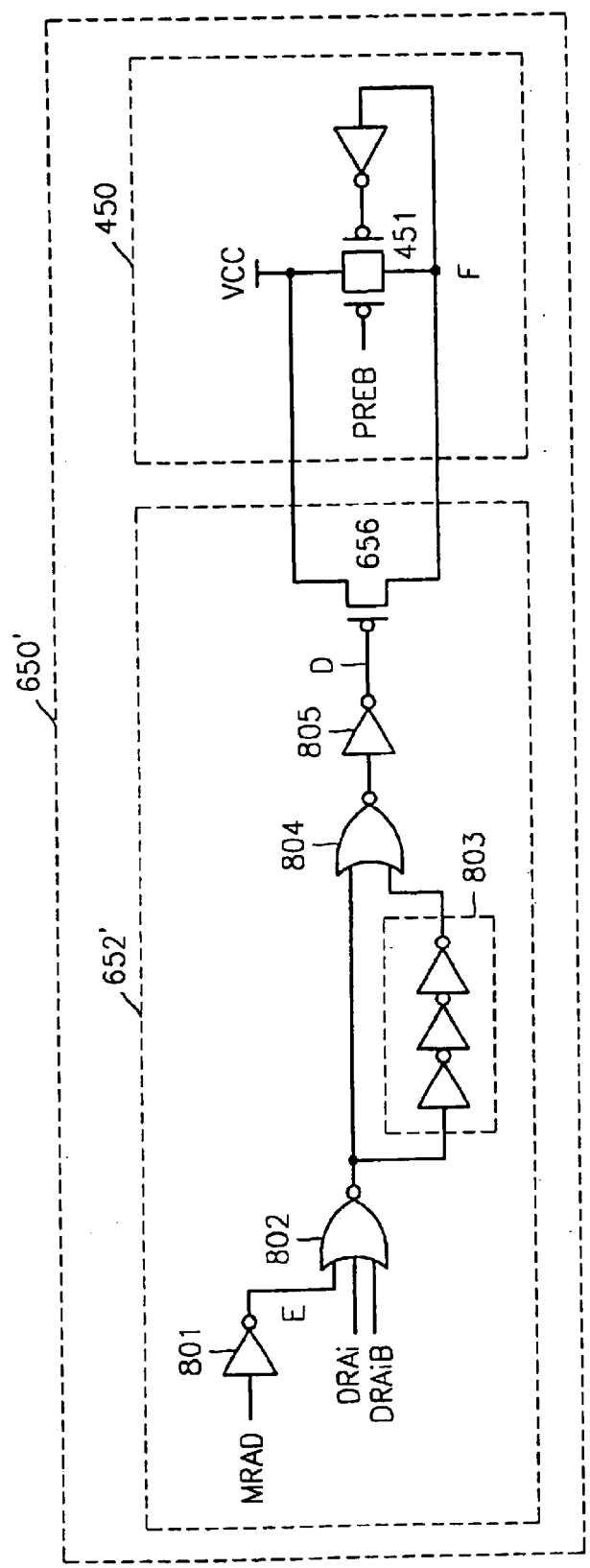
FIG. 8 is an electrical schematic of a second spare word line driver enable signal precharger according to another embodiment of the present invention.
Figure 9:
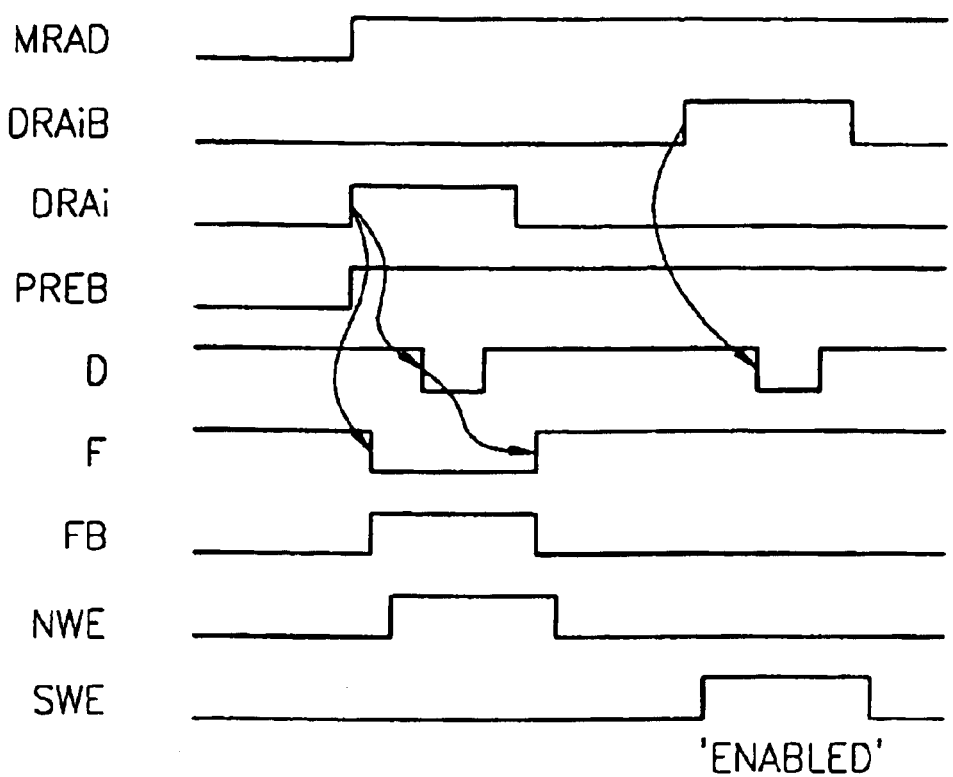
FIG. 9 is a timing diagram illustrating the operation of the precharger of FIG. 8.

Referring now to FIGS. 8–9, an enable signal precharger 650' according to an additional embodiment of the present invention includes an alternative supplemental enable signal precharger 652'. This supplemental enable signal precharger 652' operates as a pulse-generator that is responsive to a plurality of row address signals (shown as DRAi and DRAiB) and the multi-row address test signal MRAD. The pulse-generator includes inverters 801 and 805, NOR gates 802 and 804, an inverting delay circuit 803 (formed of an odd number of serially-connected inverters) and a PMOS transistor 656, connected as illustrated. As illustrated by the timing diagram of FIG. 9, node D at the gate electrode of the PMOS transistor 656 is pulsed at a logic 0 level whenever one of the row address signals DRAi or DRAiB is asserted (while the multi-row address test signal MRAD is also asserted at a logic 1 level and node E is at a logic 0 level). The width of the logic 0 pulses generated by the NOR gate 802 is a function of the delay provided by the inverting delay circuit 803. The pulsing of node D at a logic 0 level causes the PMOS transistor 656 to turn on and reset the enable signal line F to a logic 1 level if it has previously transitioned to a logic 0 level. Accordingly, the enable signal line F will be maintained at a logic 1 level during the performance of a spare word line test which typically follows a normal word line test.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a normal memory cell block having a normal word line electrically coupled thereto;
   a spare memory veil block having a spare word line electrically coupled thereto;
   a spare word line driver electrically coupled to the spare word line, said spare word line driver comprising:
   a selector that is electrically connected to a spare word line driver enable signal line;
   a programmable decoder that is configured to generate a spare word line driver enable signal on the spare word line driver enable signal line, in response to a row address; and
   a precharge circuit that is electrically coupled to the spare word line driver enable signal line, said precharge circuit comprising:
   a first precharger that is configured to precharge the spare word line driver enable signal line in response to an active precharge signal; and a supplemental precharger that is configured to precharge the spare word line driver enable signal line in response to a logical combination of an active multi-row address test signal and a row active command signal.

2. The device of claim 1, wherein said supplemental precharger comprises:

a PMOS pull-up transistor having a source terminal that is electrically connected to a power supply line and a drain terminal that is electrically connected to the spare word line driver enable signal line; and a NAND gate having a first input that is responsive to the row active command signal, a second input that is responsive to the multi-row address test signal and an output that is electrically coupled to a gate terminal of said PMOS pull-up transistor.

3. An integrated circuit memory device, comprising:

a normal memory cell block having a normal word line electrically coupled thereto;

a spare memory cell block having a spare word line electrically coupled thereto;

a spare word line driver electrically coupled to the spare word line, said spare word line driver comprising:

a selector that is electrically connected to a spare word line driver enable signal line;

a programmable decoder that is configured to generate a spare word line driver enable signal on the spare word line driver enable signal line, in response to a row address; and a supplemental precharger that is configured to precharge the spare word line driver enable signal line in response to an active multi-row address test signal, said supplemental precharger comprising:

an inverter for receiving the multi-row address test signal;

a NOR gate for receiving an output of the inverter and the row address;

a delay unit for delaying an output of the NOR gate by a fixed amount of time;

an OR gate for receiving the output of the NOR gate and an output of the delay unit; and a PMOS transistor that is configured to precharge the spare word line driver enable signal line in response to an output of the OR gate.

* * * * *

UNITED STATES PATENT AND TRADEMARK OFFICE
CERTIFICATE OF CORRECTION

PATENT NO. : 6,741,512 B2  Page 1 of 1
DATED : May 25, 2004
INVENTOR(S) : Kim et al.

It is certified that error appears in the above-identified patent and that said Letters Patent is hereby corrected as shown below:

Column 6,
Line 52, change "veil" to -- cell --.

Signed and Sealed this

Fourteenth Day of December, 2004

JON W. DUDAS
*Director of the United States Patent and Trademark Office*